(12) United States Patent
Ludurczak et al.

(10) Patent No.: US 11,600,740 B2
(45) Date of Patent: Mar. 7, 2023

(54) CONTACTING AREA ON GERMANIUM (71) Applicant: Commissariat à l'Énergie Atomique et aux Énergies Alternatives, Paris (FR)

(72) Inventors: Willy Ludurczak, Grenoble (FR); Abdelkader Aliane, Grenoble (FR); Jean-Michel Hartmann, Grenoble (FR); Zouhir Mehrez, Grenoble (FR); Philippe Rodriguez, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 121 days.

(21) Appl. No.: 17/005,245

(22) Filed: Aug. 27, 2020

(65) Prior Publication Data
US 2021/0066535 A1 Mar. 4, 2021

(30) Foreign Application Priority Data

Aug. 30, 2019 (FR) ..................... 19/09581

(51) Int. Cl.
*H01L 31/105* (2006.01)
*H01L 31/18* (2006.01)
(Continued)

(52) U.S. Cl.
CPC .... *H01L 31/1812* (2013.01); *H01L 21/28518* (2013.01); *H01L 31/02005* (2013.01);
(Continued)

(58) Field of Classification Search
CPC ......... H01L 31/1812; H01L 31/02005; H01L 31/105; H01L 31/022408; H01L 21/28518;
(Continued)

(56) References Cited

U.S. PATENT DOCUMENTS 6,593,246 B1 * 7/2003 Hasegawa ......... H01L 21/31138
257/E21.264
9,466,753 B1 * 10/2016 Ellis-Monaghan ..........................
H01L 27/1446
(Continued)

FOREIGN PATENT DOCUMENTS

EP 2 333 820 A2 6/2011

OTHER PUBLICATIONS

Preliminary Search Report for French Application No. 1909581, dated May 8, 2020.
(Continued)

*Primary Examiner* — Ahmed N Sefer
(74) *Attorney, Agent, or Firm* — Wolf, Greenfield & Sacks, P.C.

(57) ABSTRACT

A method of forming an opening in an insulating layer covering a semiconductor region including germanium, successively including: the forming of a first masking layer on the insulating layer; the forming on the first masking layer of a second masking layer including an opening; the etching of an opening in the first masking layer, in line with the opening of the second masking layer; the removal of the second masking layer by oxygen-based etching; and the forming of the opening of said insulating layer in line with the opening of the first masking layer, by fluorine-based etching.

20 Claims, 7 Drawing Sheets

(51) Int. Cl.
*H01L 31/02* (2006.01)
*H01L 21/285* (2006.01)
*H01L 31/0224* (2006.01)

(52) U.S. Cl.
CPC .... *H01L 31/022408* (2013.01); *H01L 31/105* (2013.01); *H01L 31/1055* (2013.01); *H01L 31/1804* (2013.01); *H01L 31/1808* (2013.01)

(58) Field of Classification Search
CPC ............. H01L 31/1055; H01L 31/1804; H01L 31/1808
See application file for complete search history.

(56) References Cited

U.S. PATENT DOCUMENTS

| | | | |
|---|---|---|---|
| 2002/0119380 A1* | 8/2002 | Zemen | G03F 1/46 430/30 |
| 2004/0265750 A1* | 12/2004 | Brask | H01L 21/31144 430/316 |
| 2005/0130411 A1* | 6/2005 | Bao | H01L 21/02211 257/E21.252 |
| 2005/0191852 A1* | 9/2005 | Takigawa | H01L 21/02164 257/E21.252 |
| 2006/0188827 A1* | 8/2006 | Brask | H01L 31/1808 430/323 |
| 2006/0264033 A1* | 11/2006 | Olmen | H01L 21/76813 257/774 |
| 2007/0032025 A1 | 2/2007 | Brunco et al. | |
| 2007/0105390 A1* | 5/2007 | Oh | H01L 21/32136 257/E21.252 |
| 2007/0148966 A1* | 6/2007 | Baks | H01L 21/31144 257/E21.252 |
| 2008/0146037 A1* | 6/2008 | Fuller | H01L 21/76829 257/E21.579 |
| 2008/0171408 A1 | 7/2008 | Zhu et al. | |
| 2009/0001047 A1* | 1/2009 | Pelhos | G11B 5/855 216/22 |
| 2011/0018039 A1 | 1/2011 | Zhu | |
| 2011/0027999 A1* | 2/2011 | Sparks | H01L 21/32136 438/712 |
| 2012/0329272 A1* | 12/2012 | Arnold | H01L 21/76816 438/653 |
| 2014/0127901 A1* | 5/2014 | Lu | H01L 21/76802 438/653 |
| 2014/0209985 A1 | 7/2014 | Assefa et al. | |
| 2017/0213889 A1 | 7/2017 | Gluschenkov et al. | |

OTHER PUBLICATIONS

Jin et al., The interfacial reaction of Ni with (111) Ge,(100) $Si_{0.75}Ge_{0.25}$ and (100)Si at 400° C. Thin Solid Films. Sep. 1, 2004;462:151-5.

Jung et al., Nickel mono-silicide formation using a photo-thermal process assisted by ultra-violet laser. Materials Science in Semiconductor Processing. Mar. 1, 2018;75:263-8.

Lavoie et al., Towards implementation of a nickel silicide process for CMOS technologies. Microelectronic Engineering. Nov. 1, 2003;70(2-4):144-57.

Sebaai et al., Nickel selective etch for contacts on Ge based devices. Solid State Phenomena. 2015;219:105-8.

* cited by examiner

CONTACTING AREA ON GERMANIUM

This application claims the priority benefit of French patent application number FR19/09581, the content of which is hereby incorporated by reference in its entirety to the maximum extent allowable by law.

TECHNICAL BACKGROUND

The present disclosure generally concerns electronic devices, and more particularly electronic devices comprising germanium, and electronic component manufacturing methods.

PRIOR ART

Certain electronic components, such as transistors, diodes, etc., use the properties of germanium. For example, a PIN-type photodiode, that is, a photodiode comprising an intrinsic semiconductor region between N- and P-type doped semiconductor regions, may be based on germanium. The photodiode can then detect optical radiations having wavelengths in the range from 0.9 µm to 1.5 µm.

In such a component, a region comprising germanium is intended to be electrically connected to other devices by a conductive connection. The electric contact between this region and the conductive connection is ensured by a contacting area.

The contacting area is typically located at the bottom of an opening formed in an insulating layer.

SUMMARY

There is a need to decrease the resistances and/or to increase the reliability of known contacting areas on a semiconductor region comprising germanium.

There is a need to simplify known methods of forming contacting areas on a semiconductor region comprising germanium.

An embodiment overcomes all or part of the disadvantages of known areas of contact with a semiconductor region comprising germanium.

An embodiment overcomes all or part of the disadvantages of known methods of forming areas of contact with a semiconductor region comprising germanium.

An embodiment overcomes all or part of the disadvantages of methods of etching an opening in an insulator covering a semiconductor region comprising germanium.

An embodiment overcomes all or part of the disadvantages of known PIN-type photodiodes comprising an intrinsic germanium region. In particular, an embodiment provides a photodiode having a decreased dark current.

Thus, according to a first aspect, an embodiment provides a method of forming an area of electric contact with a semiconductor region mainly made of germanium, comprising the forming of a first area made of a first intermetallic material where more than 70% of the non-metallic atoms are silicon atoms.

An embodiment provides an electronic device comprising a semiconductor region mainly made of germanium, and an area of electric contact with the semiconductor region, the contacting area comprising a first area made of a first intermetallic material where more than 70% of the non-metallic atoms are silicon atoms.

According to an embodiment, the contacting area comprises, between the first area and the semiconductor region, a second area made of a second intermetallic material where the non-metallic atoms are mainly germanium atoms.

According to an embodiment, the metallic atoms of each of the first and second intermetallic materials are mainly nickel atoms.

According to an embodiment, each of the first and second intermetallic materials comprises platinum and/or cobalt.

According to an embodiment, the first intermetallic material comprises germanium.

According to an embodiment, the forming of the first area successively comprises: a) the forming of at least one semiconductor layer covering the semiconductor region and comprising at least 70% of silicon atoms; b) the forming of a metal region on said at least one semiconductor layer; and c) the reaction of the metal region with at least a portion of said at least one semiconductor layer.

According to an embodiment, the method further comprises the reaction of the material of the metal region with that of the semiconductor region.

According to an embodiment, step c) comprises: a first thermal treatment, preferably at a temperature lower than 300° C.; a removal of portions of the metal region which have not reacted during the first thermal treatment; and a second thermal treatment, preferably at a temperature in the range from 390° C. to 420° C.

According to an embodiment, the method comprises, before step b), the forming of a protection layer, preferably made of titanium nitride, on the metal region.

According to an embodiment, the method comprises the successive forming: an additional semiconductor layer comprising at least 70% of silicon atoms; an insulating layer covering the additional semiconductor layer; and an opening crossing the insulating layer and the additional semiconductor layer, said at least one semiconductor layer being formed in the opening and forming, with the portions of the additional semiconductor layer located around the opening, a continuous layer.

According to an embodiment, the method successively comprises the forming: of a multilayer of first semiconductor layers comprising at least 70% of silicon atoms alternated with second semiconductor layers mainly made of germanium; of an insulating layer covering the multilayer; and of an opening crossing the insulating layer and a portion of the multilayer, said at least one semiconductor layer being formed of the first layers which have been left intact under the opening.

According to an embodiment, the multilayer is monocrystalline.

Another embodiment provides a method of manufacturing an electronic device, comprising the implementation of a method such as defined hereabove.

Another embodiment provides a photodiode comprising a device such as defined hereabove or a device obtained by a method such as defined hereabove.

According to a second aspect, an embodiment provides a method of forming an opening in an insulating layer covering a semiconductor region comprising germanium, successively comprising: a) the forming of a first masking layer on the insulating layer; b) the forming on the first masking layer of a second masking layer comprising an opening; c) the etching of an opening in the first masking layer, in line with the opening of the second masking layer; d) the removal of the second masking layer by oxygen-based etching; and e) the forming of the opening of said insulating layer in line with the opening of the first masking layer, by a fluorine-based etching where less than 5% of the reactive molecules used are oxygen molecules.

According to an embodiment, the insulating layer is made of silicon oxide.

According to an embodiment, the first masking layer is made of an electrically-insulating material, preferably from the group formed of HfO2, Al2O3, AlN, ZnO, SiN, and Si3N4.

According to an embodiment, step e) comprises an etching with a plasma based on C4F8 and/or CHF3, and/or with a HF solution.

According to an embodiment, the second masking layer is a polymer layer resulting from a lithography.

According to an embodiment, an additional layer, preferably made of silicon or having an atomic percentage of silicon greater than 70%, is located between said semiconductor region and said insulating layer.

An embodiment provides a method of forming a contacting area, comprising the implementation of a method such as defined hereabove, the contacting area being an area of contact with said semiconductor region and comprising an intermetallic area where more than 70% of the non-metallic atoms are silicon atoms.

According to an embodiment, the forming of said intermetallic area comprises reacting a semiconductor with a metal region, the first masking layer and the metal region comprising a same metal.

According to an embodiment, the forming of the intermetallic area comprises reacting a semiconductor with a metal region covered with a protection layer, the first masking layer and the protection layer comprising a same metal.

According to an embodiment, the method further comprises the forming of an electrically-conductive layer covering the contacting area and the walls of the opening, and the filling of the opening with a conductor covering said electrically-conductive layer.

An embodiment provides a method of forming a photodiode, comprising the forming, by a method such as defined hereabove, of first and second respective areas of contact with first and second semiconductor regions comprising germanium, the first and second semiconductor regions being doped with opposite conductivity types and separated by a third semiconductor region comprising intrinsic germanium.

According to an embodiment, a silicon-germanium layer is located between the third region and said insulating layer and is in contact with the third region.

According to an embodiment, an intrinsic germanium layer is located between said silicon-germanium layer and said insulating layer.

According to an embodiment, the method comprises the forming of insulating areas delimiting said intrinsic germanium layer and located between said intrinsic germanium layer and the first and second contacting areas.

An embodiment provides a photodiode formed by a method such as defined hereabove.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, in the electronic components, the elements other than a semiconductor region comprising germanium, a contacting area, and an electric conductor have not been described, the embodiments being compatible with known electronic components comprising a germanium region.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIGS. 1 to 4 are partial simplified cross-section views showing steps of an embodiment of a method of manufacturing a contacting area on a region comprising germanium.

The method is implemented during the manufacturing of an electronic device comprising one or a plurality of components comprising germanium or made up of germanium. The device may comprise, or be formed by, an electronic integrated circuit chip. Such a chip is defined by a semiconductor wafer portion and elements, such as electronic components, integrally located inside and on top of a surface of the wafer. In particular, the method may be implemented for the manufacturing of a photodiode comprising germanium.

Figure 1:
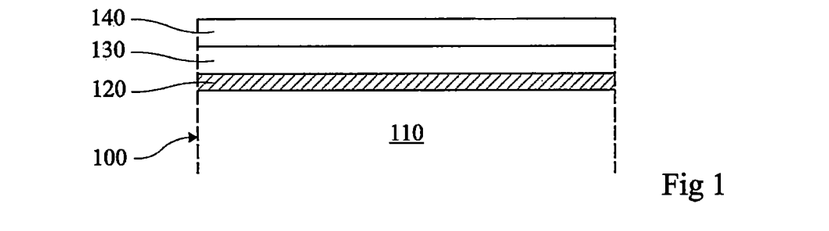
FIG. 1 is a partial simplified cross-section view showing a step of a first embodiment of a contacting area manufacturing method.

At the step of FIG. 1, a substrate 100 is provided. Substrate 100 may be formed by a semiconductor wafer portion, for example, made of germanium. Substrate 100 may also be formed by a layer covering the upper surface of a support such as, for example, a semiconductor wafer.

A semiconductor region 110 comprising germanium is located on the side of a surface of substrate 100, for example, the front or upper surface of substrate 100. In the case where substrate 100 comprises, or is formed of, germanium, region 110 is for example a doped region of the substrate. In the case where substrate 100 is made of another semiconductor than germanium, for example, silicon, semiconductor region 110 may have for example been formed in a cavity etched into substrate 100. Preferably, semiconductor region 110 is monocrystalline, substrate 100 being preferably monocrystalline. Semiconductor region 110 may then result from an epitaxy.

Region 110 is primarily, that is, mainly, made of germanium. In other words, region 110 is made of a semiconductor material having an atomic percentage of germanium greater than 50%, preferably greater than 90%. In a preferred example, region 110 is made of germanium, for example, doped. More preferably, region 110 is made of single-crystal germanium. In another example, region 110 is made of silicon-germanium, for example, doped.

A semiconductor layer 120 having an atomic percentage of silicon greater than 70% is formed on semiconductor region 110. Layer 120 may comprise, in addition to silicon, a metalloid different from silicon, preferably germanium. In a preferred example, layer 120 is made of silicon. In another example, layer 120 is made of silicon-germanium.

Preferably, semiconductor layer 120 is monocrystalline. For this purpose, layer 120 may be obtained by epitaxy on monocrystalline region 110. The thickness of semiconductor layer 120 is smaller than a thickness threshold enabling the epitaxial layer to be monocrystalline. The thickness threshold may be experimentally determined according to the composition of semiconductor layer 120 and of semiconductor region 110. This threshold is in the order of 2 nm for an epitaxial silicon layer 120 on germanium region 110. As a variation, semiconductor layer 120 is not monocrystalline. The thickness of layer 120 may then be greater than the thickness threshold.

A metal layer 130 covering semiconductor layer 120 is then formed. Preferably, metal layer 130 comprises nickel, for example, is substantially made of the nickel, for example, is made of nickel. Preferably, layer 130 comprises, in addition to nickel, platinum and/or cobalt. In a preferred embodiment, the metal of layer 130 comprises, more preferably is made of, nickel and cobalt, the atomic percentage of cobalt being in the range from 5 to 20%. In another preferred example, the metal of layer 130 comprises, more preferably is formed by, nickel and platinum, the atomic percentage of platinum being in the range from 5 to 15%.

Preferably, the thickness of metal layer 130 is greater than half of that of semiconductor layer 120. More preferably, metal layer 130 has a thickness in the range from 7 to 50 nm.

Preferably, before the deposition of metal layer 130, a preparation of the upper surface of semiconductor layer 120 has been previously performed. The surface preparation step for example comprises a treatment in liquid phase based on hydrofluoric acid, and then a plasma treatment. The plasma may be argon-based or, for example, of the type known under trade name Siconi™. The plasma treatment and the deposition of metal layer 130 are then successively performed with no rupture of vacuum. This enables to avoid the presence of impurities, such as oxides, between semiconductor layer 120 and metal layer 130. Such impurities might originate from an exposure to air after the step of deposition of layer 120, or after the step of liquid phase surface preparation. Semiconductor layer 120 and metal layer 130 are thus directly in contact one on the other.

Preferably, after the forming of metal layer 130, a protection layer 140 is formed on layer 130. This layer is then preferably formed with no rupture of vacuum after the deposition of metal layer 130. Layer 140 is intended to protect the structures located under layer 140 against oxidation during subsequent steps of the method. Preferably, protection layer 140 is made of titanium nitride. As a variation, protection layer 140 may be omitted.

Figure 2:
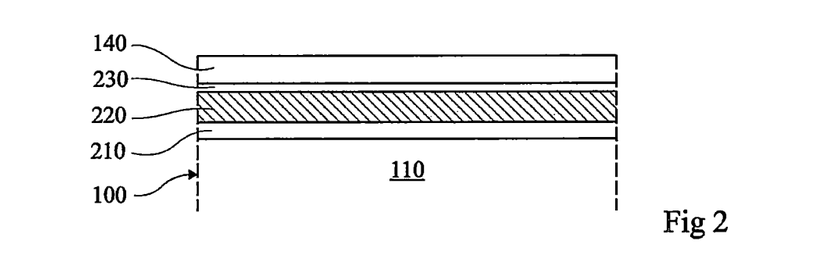
FIG. 2 is a partial simplified cross-section view showing another step of the first embodiment.

At the step of FIG. 2, a first thermal treatment is performed. More particularly, such a thermal treatment corresponds to an anneal of the structure obtained in FIG. 1. The first thermal treatment is carried out at a temperature enabling to partially react the metal of metal layer 130 with the material of semiconductor layer 120. A layer 220 is thus obtained instead of layer 120. The temperature of the first thermal treatment is preferably smaller than or equal to 300° C., for example, in the range from 250° C. to 300° C., which allows a partial reaction of layer 130 comprising nickel with the material of semiconductor layer 120.

Preferably, the first thermal treatment is performed in the presence of nitrogen. Nitrogen is preferably at the atmospheric pressure or at a pressure greater by less than 1 bar than the atmospheric pressure. The duration of the first thermal treatment is preferably in the range from 10 s to 120 s.

Layer 220 comprises, preferably is made of, an intermetallic material, or intermetallic compound, that is, the association of one or a plurality of metallic chemical elements and of one or a plurality of chemical elements, typically metalloids, capable of entering in the composition of a semiconductor. Preferably, the intermetallic material has a crystal structure associating the metallic and non-metallic chemical elements. In layer 220, the non-metallic chemical elements are substantially formed of the material of semiconductor layer 120. Particularly, the fact that more than 70% of the atoms of semiconductor layer 120 are silicon atoms implies that more than 70% of the non-metallic atoms of layer 220 are silicon atoms. In a preferred example, the intermetallic material of layer 220 is a nickel silicide or a silicide comprising nickel. In another preferred embodiment, the intermetallic material of layer 220 is a nickel germanium silicide or a germanium silicide comprising nickel.

Preferably, the thickness of metal layer 130 selected at the step of FIG. 1 is sufficient for a portion of the metal of layer 130 to react with an upper portion of semiconductor region 110. This reaction generates a layer 210 located under layer 220. Layer 210 comprises, preferably is made of, an intermetallic material. Due to the fact that region 110 is mainly made of germanium, the non-metallic atoms of layer 210 mainly are germanium atoms. Thus, when metal layer 130 is made of nickel or comprises nickel, the intermetallic material of layer 210 is made of nickel germanide or of a germanide comprising nickel.

Preferably, the thickness of metal layer 130 selected at the step of FIG. 1 is sufficient for a portion 230 of metal layer 130 not to react with semiconductor layer 120 and semiconductor region 110.

Figure 3:
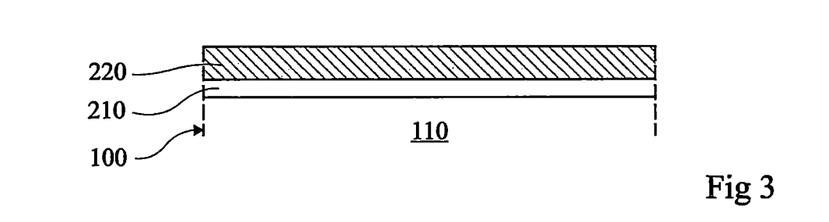
FIG. 3 is a partial simplified cross-section view showing another step of the first embodiment.

At the step of FIG. 3, the possible protection layer 140, as well as the portion 230 of layer 130 which has not reacted, is removed. Such a removal is selective over the material of layer 220. The removal is for example performed in an etching solution based on sulfuric acid and on hydrogen peroxide, or also for example in an etching solution based on hydrochloric acid and on nitric acid. Due to the fact that layer 220 comprises, in addition to the metal elements, more than 70% of silicon atoms, such solutions enable to etch the materials of layers 130 and 140 without removing or altering layer 220.

Figure 4:
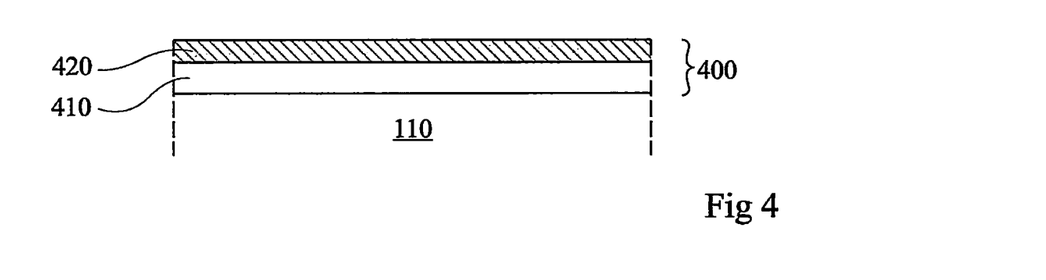
FIG. 4 is a partial simplified cross-section view showing another step of the first embodiment.

At the step of FIG. 4, a second thermal treatment is performed. The thermal treatment corresponds to an anneal of the structure obtained at the step of FIG. 3. This transforms layers 210 and 220 into respective layers 410 and 420.

When layer 130 comprises nickel, the thermal treatment temperature is preferably higher than or equal to 390° C. This enables, after the second thermal treatment, the phase of the intermetallic material of layer 420 to have an electric resistivity smaller than that of the other phases of this intermetallic. Particularly, this enables layer 420 to comprise the same proportion of metal atoms as of non-metal atoms, for example, to comprise the same atomic proportions of nickel and of silicon (NiSi). As an example, part of the nickel contained in layer 220 at the step of FIG. 3 reacts with semiconductor region 110 during the second anneal. The thickness of layer 410 is then greater than that of layer 210 (FIGS. 2 and 3). As a variation, layer 210 is not formed during the first thermal treatment, and only layer 410 is formed during the second thermal treatment. The abovementioned fact that at the step of FIG. 1, the thickness of metal layer 130 is preferably greater than half of that of semiconductor layer 120, enables to obtain layer 410 during the second thermal treatment.

Further, when layer 130 comprises nickel, the thermal treatment temperature is preferably lower than 420° C. This enables to optimize the resistivity of the nickel germanide of layer 410, and to avoid deteriorating this resistivity by too high a temperature.

The intermetallic areas defined by the layers 410 and 420 thus obtained form an electric contacting area 400 on semiconductor region 110.

It could have been devised to form a contacting area which does not comprise layer 420. For this purpose, it could have been imagined to implement steps similar to those of FIGS. 1 to 4, without however forming silicon layer 120. However, during a step, such as that of FIG. 3, of removal of the portion of a metal layer which has not reacted, the contact between the germanium and an etching solution would have risked oxidizing the germanium and dissolving the germanium oxide in the solution. This would have damaged semiconductor region 110. This would have resulted in problems of reliability and of resistance of the contacting area.

Thus, the presence of layer 420 enables to obtain a contacting area 400 on germanium having a better resistivity and reliability than a contacting area comprising no such layer.

Figure 5:
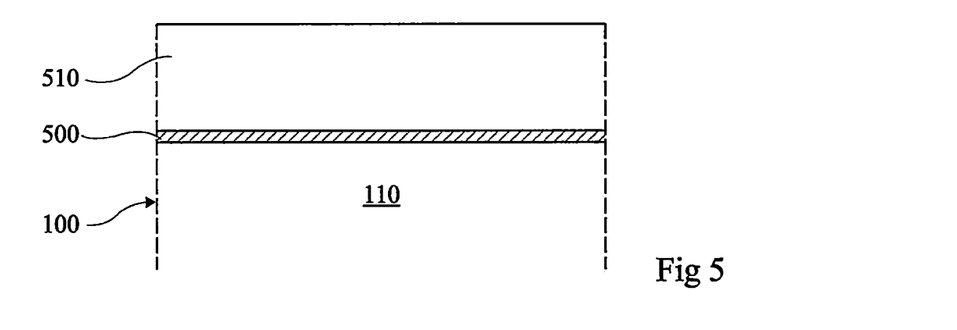
FIG. 5 is a partial simplified cross-section view showing a step of a second embodiment of a contacting area manufacturing method.
Figure 6:
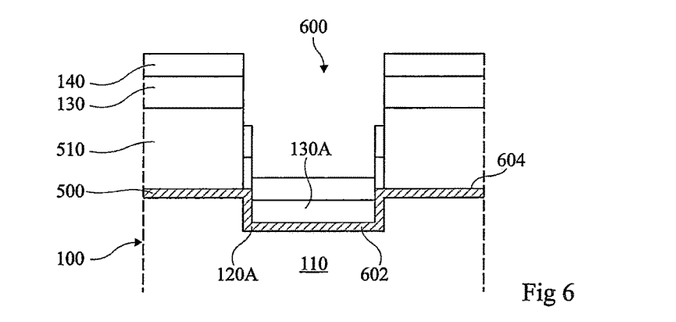
FIG. 6 is a partial simplified cross-section view showing another step of the second embodiment.
Figure 7:
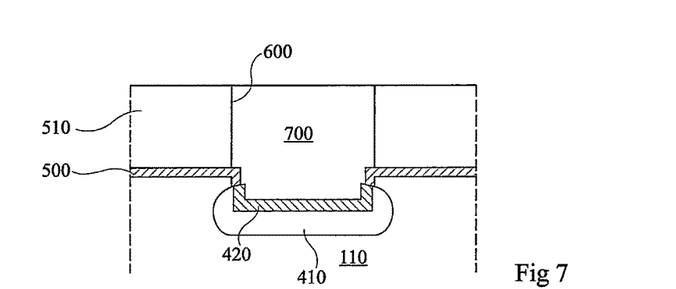
FIG. 7 is a partial simplified cross-section view showing another step of the second embodiment.

FIGS. 5 to 7 are partial simplified cross-section views showing steps of another embodiment of a method of manufacturing a contacting area on a semiconductor region 110 comprising germanium. Semiconductor region 110 is identical or similar to that described in relation with FIG. 1, and is preferably located in the upper portion of a substrate 100.

At the step of FIG. 5, preferably, a semiconductor layer 500 comprising silicon is formed on the upper surface of semiconductor region 110. Layer 500 is made of silicon or has an atomic percentage of silicon greater than 70%. As an example, layer 500 is grown by epitaxy on the surface of semiconductor region 110. The thickness of layer 500 is for example in the range from 1 nm to 3 nm, preferably in the order of 2 nm.

An electrically-insulating layer 510 is then formed on semiconductor layer 500. Insulating layer 510 may be made of silicon oxide, preferably of silicon dioxide, more preferably resulting from a hydrolysis of tetraethyl orthosilicate (TEOS). In an example, insulating silicon oxide layer 510 is a passivation layer. Preferably, the thickness of insulating layer 510 is in the order of, or greater than, 100 nm.

At the step of FIG. 6, an opening 600 thoroughly crossing insulating layer 510 at the location of the future contacting area is etched. Preferably, opening 600 is formed only above a portion of semiconductor region 110. The width of the opening may be in the range from 300 nm to 1.5 µm. Opening 600 is compatible with any usual method of obtaining an opening in an insulating layer, for example, a photolithography followed by a plasma etching (the etch mask is not shown). In practice, opening 600 is continued through layer 500 down to a level located in semiconductor region 110. The level difference, that is, the distance in the direction orthogonal to the upper surface of substrate 100, between the bottom 602 of opening 600 and the upper surface 604 of semiconductor layer 500, is for example in the range from 5 nm to 30 nm, preferably in the order of 10 nm.

A semiconductor layer 120A is then grown by epitaxy. Layer 120A is identical by its composition and its thickness to the semiconductor layer 120 of the method of FIGS. 1 to 4. Semiconductor layer 120A increases from bottom 602 and the portions of the lateral walls of opening 600 located below the upper level 604 of layer 500. As a result, the semiconductor region defined by layer 120A forms, with the remaining portions of layer 500, a continuous semiconductor layer, that is, comprising no openings, covering semiconductor region 110, such a continuous layer comprising at least 70% of silicon.

After this, the metal layer 130 and possibly the protection layer 140 described in relation with FIG. 1 are successively formed. Layers 130 and 140 cover the bottom of opening 600 and the remaining portions of insulating layer 510. Preferably, the total thickness of metal layer 130 and of protection layer 140 is smaller than those of insulating layer 510. In the shown example, metal layer 130 and protection layer 140 are formed by non-conformal deposition, that is, the materials of these layers are only deposited on the upward-facing surfaces. Due to the fact that the thickness of metal layer 130 is smaller than that of insulating layer 510, this results in a metal region 130A with no contact with the rest of layer 130, and located at the bottom of opening 600. The step described herein is not limiting, and any method enabling to form a metal region 130A on a portion only of semiconductor region 110 may be used. As a variation, metal layer 130 and/or protection layer 140 may be formed by conformal deposition.

At the step of FIG. 7, the steps of FIGS. 2 to 4, that is, successively, the first thermal treatment, the removal of the possible protection layer 140 and of the remaining portions of metal layer 130, and the second thermal treatment, are implemented. This results, on region 110 mainly made of germanium, in a contacting area comprising an intermetallic area 420 formed from semiconductor layer 120A. Among the non-metallic atoms of area 420, more than 70% are silicon atoms. Preferably, in the same way as for the layer 420 of FIG. 4, the non-metal atoms of area 420 are silicon atoms. More preferably, area 420 comprises nickel silicide.

Preferably, as for the method of FIGS. 1 to 4, metal layer 130 is selected to be sufficiently thick to form, under layer 420, an intermetallic area 410, where the non-metal atoms mainly are germanium atoms. More preferably, area 410 comprises, for example, is made of, nickel germanium.

Then, opening 600 is filled with an electric conductor 700. Conductor 700 enables to establish an electric connection with semiconductor region 110. For example, conductor 700 may be covered and in contact with a track of electric connection between components of an electronic chip.

An advantage of the method of FIGS. 5 to 7 is that the area of contact with semiconductor region 110, formed by areas 420 and 410, is self-aligned with conductor 700. In an electronic chip comprising a plurality of contacting areas obtained by the method of FIGS. 5 to 7, this enables to have contacting areas closer than in a device where the contacting areas are thus not self-aligned. The chip component density can thus be increased, that is, improved.

Figure 8:
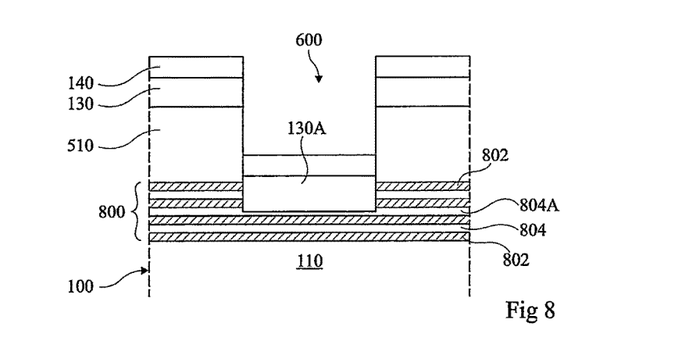
FIG. 8 is a partial simplified cross-section view showing a step of a third embodiment of a contacting area manufacturing method.
Figure 9:
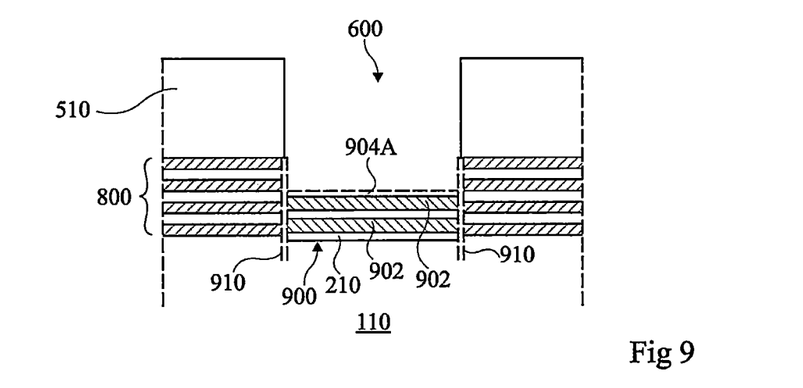
FIG. 9 is a partial simplified cross-section view showing another step of the third embodiment.
Figure 10:
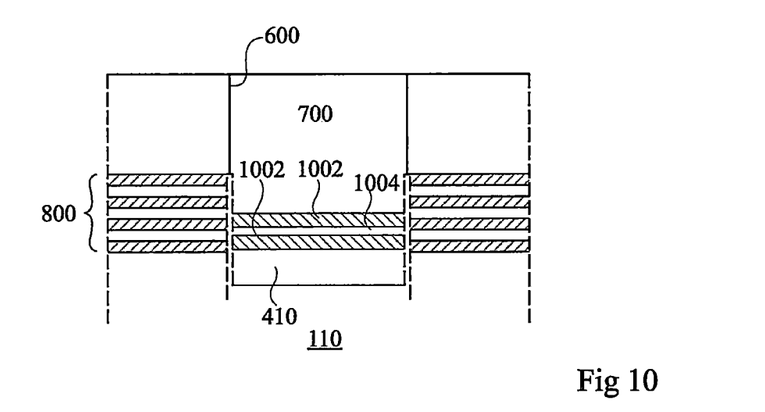
FIG. 10 is a partial simplified cross-section view showing another step of the third embodiment.

FIGS. 8 to 10 are partial simplified cross-section views showing steps of another embodiment of a method of forming a local contacting area on a semiconductor region 110 comprising germanium. FIGS. 8 to 10 are partial simplified cross-section views showing steps of another embodiment of a method of forming a local contacting area on a semiconductor region 110 comprising germanium.

At the step of FIG. 8, semiconductor region 110 is covered with a multilayer 800 comprising, in alternation, silicon layers 802 and germanium layers 804. More particularly, layers 802 have an atomic proportion of silicon greater than 70%. Preferably, layers 802 are made of silicon or of silicon-germanium having an atomic proportion of silicon greater than 70%. Layers 804 are made of germanium or are mainly made of germanium. Preferably, layers 804 are made of germanium, or of silicon-germanium mainly made of germanium. As an example, the thickness of multilayer 800 is greater than 10 nm, preferably in the order of 15 nm. Preferably, layers 802 have the same thickness. Preferably, layers 804 have the same thickness. Preferably, layers 802 and 804 all have the same thickness.

Preferably, multilayer 800 is formed by epitaxy on the upper surface of monocrystalline region 110. Each of layers 802 and 804 then has a thickness smaller than a thickness threshold below which the layer remains monocrystalline. In practice, such a threshold, or critical thickness, depends on the composition of layers 802 and 804. As an example, each of layers 802 and 804 has a thickness in the order of, or smaller than, 2 nm. Thus, the obtained multilayer 800 is monocrystalline.

Steps similar to those of FIGS. 5 and 6, that is, the successive forming of an insulating layer 510, of an opening 600 thoroughly crossing insulating layer 510, of a metal layer 130, and of a possible protection layer 140, are then implemented. In practice, opening 600 extends down to a level located inside of multilayer 800. In the shown example, the bottom of opening 600 is located in a layer 804A among the layers 804 mainly made of germanium. In another example, the bottom of opening 600 stops inside of one of layers 802, or at an interface between one of layers 802 and one of layers 804. At least one of layers 802 comprising at least 70% of silicon is not reached by opening 600 and is thus left intact. In the shown example, two of layers 802 are not etched.

At the step of FIG. 9, the steps of FIGS. 2 and 3, that is, the first thermal treatment and the removal of the possible protection layer 140 and of the remainders of metal layer 130, have been successively implemented. Preferably, the thickness of the metal layer 130 deposited at the step of FIG. 8 is selected to be sufficient for each of layers 802 and 804, as well as for a portion of semiconductor region 110, to react with the metal of metal layer 130. The reaction of each of layers 802, 804 with the material of metal region 130A generates an area 902 under opening 600. The portions of the structure located between areas 902 and the rest of multilayer 800, delimited in the drawing by dotted lines 910, are not shown.

Preferably, layer 904A (shown in dotted lines), which results from the reaction of layer 804A with the material of metal layer 130, is also removed. Such a removal is preferably performed with the same etching solution as that used to remove the remaining portions of metal region 130A. This is possible due to the fact that the non-metal atoms of area 904A mainly are germanium atoms. This enables to avoid keeping the area 904A which would have been damaged by the etching solution. The upper surface of the area 902 which was under and in contact with area 904A before the removal, is thus made accessible. Due to the fact that more than 70% of, or all, the non-metal atoms of area 902 are made of silicon, the etch solution leaves area 902 intact. Area 902 is thus not damaged by the etching. Thus, semiconductor region 110 is protected from the etching solution by at least one of areas 902.

At the step of FIG. 10, the second thermal treatment, such as described in relation with FIG. 4, is carried out. This transforms areas 902 into areas 1002 and 1004. This results in a contacting area formed, in this example, of a plurality of stacked intermetallic areas. Neighboring intermetallic areas are in contact with one another. From semiconductor region 110, the contacting area successively comprises the area 410 resulting from the reaction of a portion of semiconductor region 110 with metal layer 130; and:

an area 1002 having more than 70% of the non-metal atoms made of silicon; or a plurality of areas 1002 having more than 70% of the non-metal atoms made of silicon, separated by one or a plurality of areas 1004 having their non-metal atoms mainly made of germanium.

The rest of the cavity of opening 600 is then filled with an electric conductor 700, preferably metallic. The area 1002 located in the upper portion of the contacting area is in electric contact with conductor 700. Due to the fact that upper area 902 (FIG. 9) has not been altered during the removal of the portions which have not reacted of metal layer 130, and to the fact that there is no intermetallic area originating from area 904A between area 1002 and electric conductor 700, the resistance and the reliability of the contact between the contacting area and conductor 700 are optimized.

In the preferred case of a monocrystalline stack 800, the assembly of the contacting area and of semiconductor region 110 is monocrystalline. Thereby, the electric resistance of the contacting area is smaller than that of a non-monocrystalline contacting area. This provides an additional improvement of the electric resistance.

FIGS. 11 to 15 are partial simplified cross-section views showing successive steps of an implementation mode, in the example of the second embodiment (FIGS. 5 to 7), of a method of forming an opening in the insulating layer covering a semiconductor region comprising germanium. More particularly, the method is here applied to the forming, from the structure obtained at the step of FIG. 5, of an opening 600 (FIG. 6) in the insulating layer 510 covering semiconductor region 110.

As mentioned in relation with FIG. 5, layer 510 is preferably made of silicon oxide, more preferably of silicon dioxide, more preferably still resulting from a hydrolysis of TEOS. In a variant, layer 510 may also be made of silicon nitride.

In the example of the structure obtained at the step of FIG. 5, as mentioned hereabove, an additional semiconductor layer 500 is located under insulating layer 510. More particularly, semiconductor layer 500 is located between semiconductor region 110 and insulating layer 510. Semiconductor layer 500 is in contact with insulating layer 510. Layer 500 is made of silicon, or has an atomic percentage of silicon greater than 70%, layer 500 for example being made of silicon-germanium. The silicon layer 500 in contact with insulating layer 510 then enables to improve the stability of insulating layer 510 with respect to a structure which does not comprise layer 500.

Figure 11:
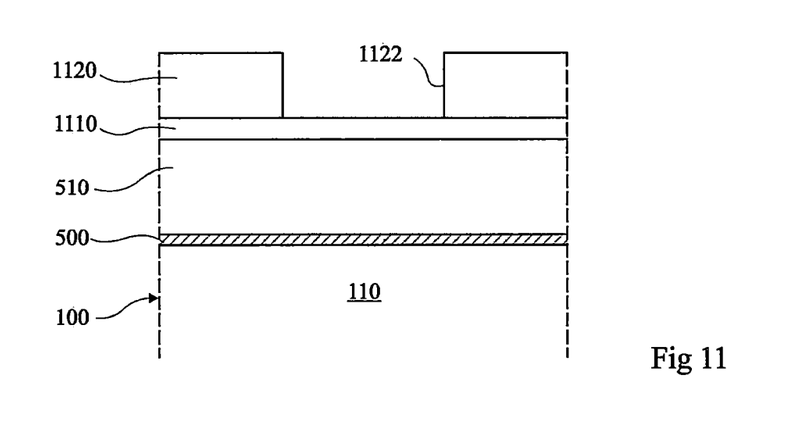
FIG. 11 is a partial simplified cross-section view showing a step of an implementation mode, in the example of the second embodiment, of a method of forming an opening in an insulating layer covering a semiconductor region comprising germanium.

At the step of FIG. 11, a first masking layer 1110 is formed on insulating layer 510. Masking layer means a layer intended to be crossed by one or a plurality of through openings and of being used during an etch step to give way to etching reactants only through these openings.

Preferably, first masking layer 1110 is made of a dielectric material, that is, electrically-insulating. An advantage is that such a material may be left in place on insulating layer 510 without creating a short-circuit between future conductive elements in contact with first masking layer 1110. A step of removing first masking layer 1110 is thus avoided.

First masking layer 1110 may comprise, for example, be made of, at least one layer made of a material selected from the group formed of:
hafnium oxide HfO2, preferably deposited by atomic layer deposition ALD;
aluminum oxide Al2O3, preferably deposited by ALD;
aluminum nitride AlN, preferably deposited by physical vapor deposition PVD;
zinc oxide ZnO, preferably deposited by PVD; and
a silicon nitride such as SiN or Si3N4, preferably deposited by chemical vapor deposition CVD, more preferably low pressure CVD (LPCVD), that is, where the pressure is sub-atmospheric.

A second masking layer 1120 comprising an opening 1122 is then formed on first masking layer 1110. Opening 1122 is located vertically in line with the location of the future opening 600, second masking layer 1120 is made of polymer and preferably results from the lithography of a positive or negative resin such as a resist.

Figure 12:
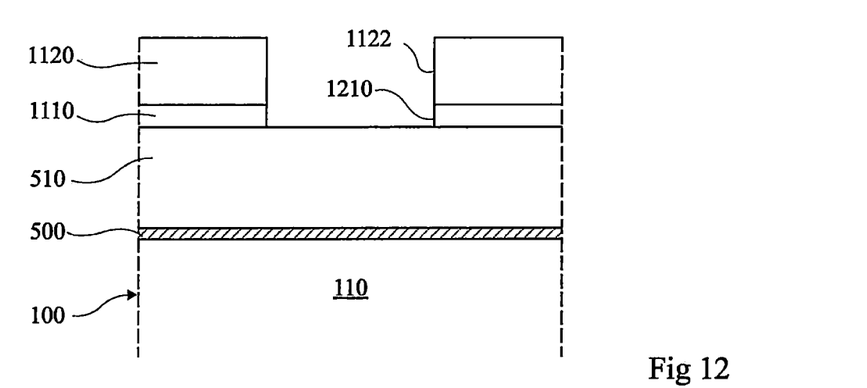
FIG. 12 is a partial simplified cross-section view showing another step of the implementation mode of the method of forming an opening.

At the step of FIG. 12, a through opening 1210 located in line with the opening 1122 of second masking layer 1120 is etched in first masking layer 1110. The etching preferably stops on the upper surface of insulating layer 510. As a variation, the etching stops at a level located in insulating layer 510. Thus, in line with opening 1210, insulating layer 510 is left in place, over at least a portion of its thickness, on semiconductor layer 500 and semiconductor region 110.

A possible step of removal of etching residues (not shown), that is, a cleaning step, may then be implemented. As an example, the cleaning is performed by a solution of hydrofluoric acid HF.

Figure 13:
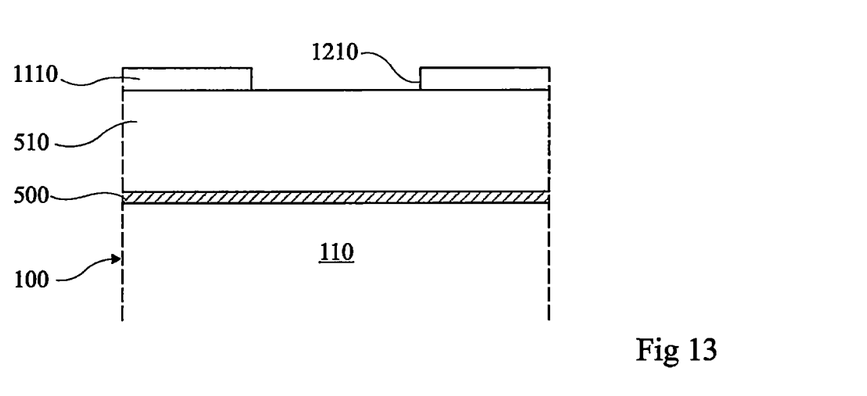
FIG. 13 is a partial simplified cross-section view showing another step of the implementation mode of the method of forming an opening.

At the step of FIG. 13, the second masking layer is removed by oxygen-based etching, typically by means of plasma. For example, the plasma only comprises oxygen or comprises, in addition to oxygen, carbon tetrafluoride CF4. The temperature during the etching is typically in the range from 120 to 220° C. Such a plasma enables to remove second masking layer 1120 when it results from a lithography or from any other method of forming a masking layer comprising openings and removable by oxygen-based etching.

Figure 14:
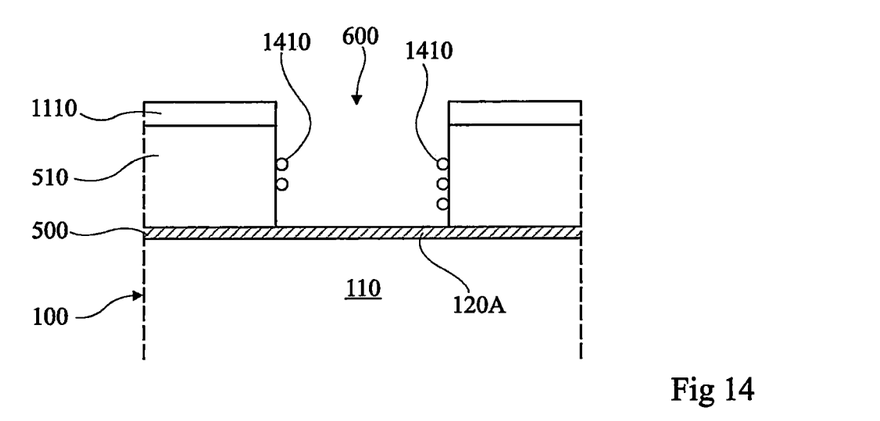
FIG. 14 is a partial simplified cross-section view showing another step of the implementation mode of the method of forming an opening.

At the step of FIG. 14, opening 600 is formed in line with the opening 1210 of first masking layer 1110, by fluorine-based etching, that is, an etching mainly by one or a plurality of reactants comprising fluorine. Mainly means that more than half, preferably more than 90%, or more preferably still more than 99%, of the reactive molecules used for the etching are fluorinated. More particularly, the etching is substantially carried out in the absence of oxygen, that is, less than 5%, preferably than 1% of the reactive molecules used for the etching are oxygen, O2. Preferably, less than 5%, more preferably less than 1%, of the reactive molecules used for the etching comprise oxygen. More preferably, the etching reactant(s) are oxygen-free. In the present implementation mode, the etching is a reactive ion etching RIE, for example, with octafluorocyclobutane C4F8 and/or with trifluoromethane CHF3.

The above-mentioned fact that first masking layer 1110 is in the group formed of HfO2, Al2O3, AlN, ZnO, SiN, and Si3N4 enables to selectively etch the material of insulating layer 510 over the material of first masking layer 1110. Indeed, in the preferred case where the insulating layer is made of silicon oxide resulting from a hydrolysis of TEOS, the speed of the etching of insulating layer 510 is then more than 5 times faster than the speed of the etching of the material of the masking layer. In particular, according to a preferred embodiment, the first masking layer is made of HfO2 or Al2O3, and the speed of the etching of the silicon oxide resulting from a hydrolysis of TEOS is then more than 10 times faster than the speed of the etching of the material of the first masking layer.

In practice, etching residues 1410 may remain on the sides and the bottom of opening 600. A cleaning step described hereafter in relation with FIG. 15 may then be provided.

Figure 15:
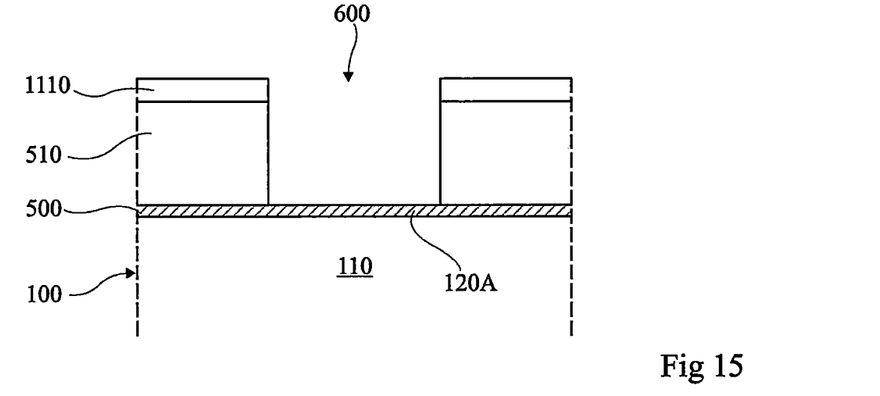
FIG. 15 is a partial simplified cross-section view showing another step of the implementation mode of the method of forming an opening.
Figure 16:
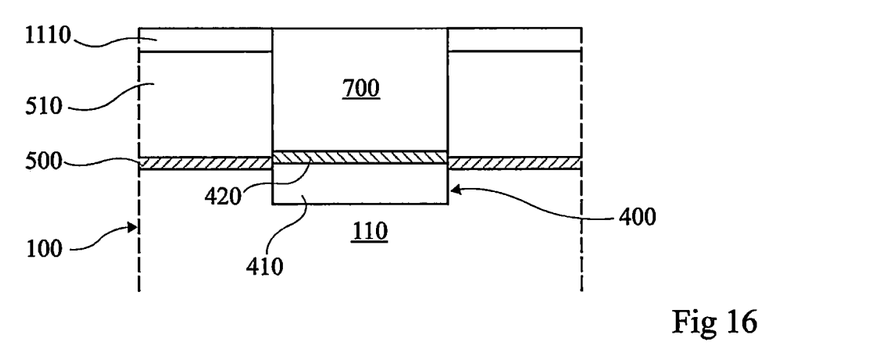
FIG. 16 is a partial simplified cross-section view showing a fourth embodiment of a contacting area manufacturing method, implementing the steps of FIGS. 11 to 15.

At the step of FIG. 5, etching residues 1410 are removed. As an example, to achieve this, a HF solution is used. The solution preferably has a HF concentration in the range from 0.1 to 1 mol. % and is applied for a duration in the range from 10 to 30 s.

At the end of the steps of FIGS. 11 to 15, opening 600 is thus obtained in insulating layer 510 covering semiconductor region 110. Instead of forming opening 600 with the steps of FIGS. 11 to 15, it would be possible to directly form a single polymer masking layer on insulating layer 510, to etch opening 600, and then to remove the masking layer by oxygen-based etching. The thickness, mentioned hereabove, of layer 500 would then have been too small to avoid for layer 500 to be oxidized across its entire thickness, and for part of the germanium of semiconductor region 110 to be also oxidized. This would have resulted in an extension of opening 600 below the lower level of insulating layer 510, as mentioned hereabove in relation with FIGS. 6 and 8.

As compared with steps implementing a single masking layer, the steps of FIGS. 11 to 15 enable insulating layer 510 to protect semiconductor layer 500 from oxidation during the removal of the polymer masking layer. In particular, this enables to leave in place a region 120A of semiconductor layer 500 at the bottom of the opening. This also enables to form opening 600 without oxidizing the germanium of semiconductor region 110. It is thus avoided for semiconductor region 110 to be damaged by oxidation.

Although the steps of FIGS. 11 to 15 are here implemented in the example of the forming of opening 600 in insulating layer 510, steps similar to those of FIGS. 11 to 15 may be implemented to form any opening in any insulating layer covering a semiconductor region mainly formed of germanium, the insulating layer being preferably made of silicon oxide and more preferably of silicon oxide resulting from a hydrolysis of TEOS. In particular, layer 500 may be omitted. As a variation, the insulating layer may be made of silicon nitride, those skilled in the art then being capable of defining the material of the first masking layer to obtain a selective fluorine-based etching of the silicon nitride over the masking layer.

FIG. 6 is a partial simplified cross-section view showing a fourth embodiment of a method of manufacturing a contacting area, implementing the steps of FIGS. 11 to 15.

After the steps of FIGS. 11 to 15, one successively implements:

in the way described in relation with FIG. 6, the forming of metal layers 130 (FIG. 6) and possibly of protection layer 140 (FIG. 6); and in the way described in relation with FIG. 7, the first thermal treatment, the removal of the possible protection layer 140 and of the remaining portions of metal layer 130, the second thermal treatment, and the filling of opening 600 with an electric conductor 700.

As mentioned hereabove, this results, on region 110 mainly made of germanium and preferably doped, in a contacting area 400 comprising an intermetallic layer 420 formed from semiconductor region 120A (FIG. 6). The intermetallic layer results from the reaction of a region 130A (FIG. 6) of metal layer 130 with semiconductor region 120A.

As mentioned, the steps of FIGS. 11 to 15 enable to avoid for semiconductor region 110 to be damaged by oxidation. Further, semiconductor region 110 is preferably doped. Now, the higher the doping level of semiconductor region 110, the more this region is sensitive to oxidation, and this, more particularly for a doping resulting from an ion implantation. The obtained contacting area 400 thus has a lower resistance and a higher reliability than those of a contacting area for which opening 600 has been formed by a method with a single masking layer.

Region 120A, which forms intermetallic area 420 by reaction with metal region 130A, is formed by a portion of semiconductor layer 500. Due to the fact that semiconductor layer 500 has an atomic percentage of silicon greater than 70%, more than 70% of the non-metal atoms of intermetallic area 420 are silicon atoms. As a variation, region 120 comprises or is formed by a semiconductor layer formed on semiconductor layer portion 500 or, in the absence of semiconductor layer 500, directly on semiconductor region 110.

Electric conductor 700 is preferably obtained by forming a metal layer over the entire upper surface of the structure. The portions of the metal layer located above the upper level of first masking layer 1110 are then removed. Such a removal is for example performed by mechanical-chemical polishing. First masking layer 1110 may then advantageously be used as a stop layer.

Although, in the steps of FIGS. 11 to 16, the first masking layer is made of an electrically-insulating material that may be left in place, this is not limiting. As a variation, it may be provided for first masking layer 1110 to be made of a conductive material and to be removed after the forming of opening 600.

In this case, according to a preferred embodiment, first masking layer 1110 and metal region 130A (FIG. 6) comprise, preferably are made of, the same or same metals. Thus, first masking layer 1110 may advantageously be removed at the same time as the portions of metal layer 130 remaining after the forming of the contacting area.

According to another preferred embodiment, the first masking layer 1110 and the protection layer 140 (FIG. 6) covering metal region 130A comprise, preferably are made of, a same or same metal(s). Thus, first masking layer 1110 may advantageously be removed at the same time as protection layer 140.

Figure 17:
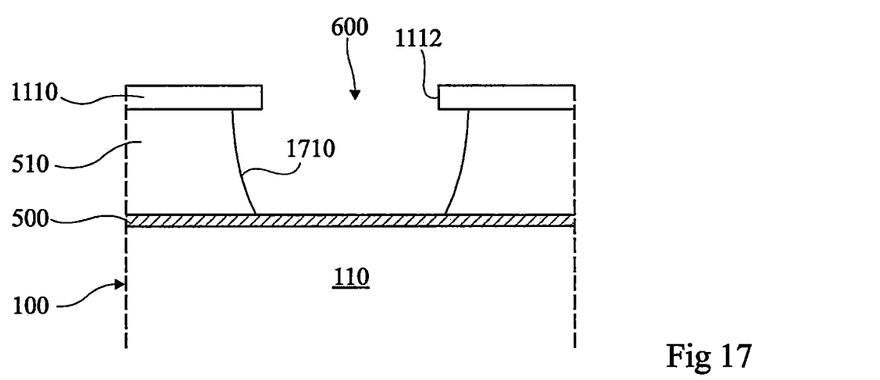
FIG. 17 is a partial simplified cross-section view showing an alternative implementation mode of the method of forming an opening.

FIG. 17 is a partial simplified cross-section view showing an alternative implementation mode of the method of FIGS. 11 to 15.

The variant of FIG. 17 corresponds to the method of FIGS. 11 to 15 where, at the step of FIG. 14, the etching with a fluorinated base is at least partly implemented by an HF solution. The HF solution preferably has a concentration greater than that of the HF solution used at the cleaning step of FIG. 15, for example, greater than 5 mol. %. Such an etching is substantially isotropic. As a result, the opening 600 in the insulating layer is wider than the opening 1112 in first masking layer 1110. In other words, the sides 1710 of opening 600 are topped with the edges of opening 1112.

As compared with the previously-mentioned case, where layer 510 is made of silicon nitride, the fact of providing for layer 510 to be made of silicon oxide advantageously enables the etching with a fluorinated plasma to be easier and/or the shapes of the sides and the dimensions of opening 600 to be better controlled.

The fluorine-based etching step may be followed by a cleaning step corresponding to the step of FIG. 15.

Figure 18:
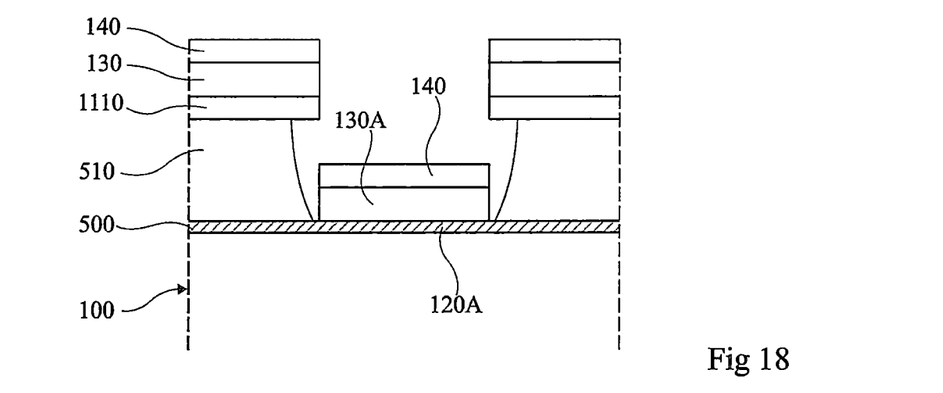
FIG. 18 is a partial simplified cross-section view showing a step of a variant of the fourth embodiment, implementing the variant of FIG. 17.
Figure 19:
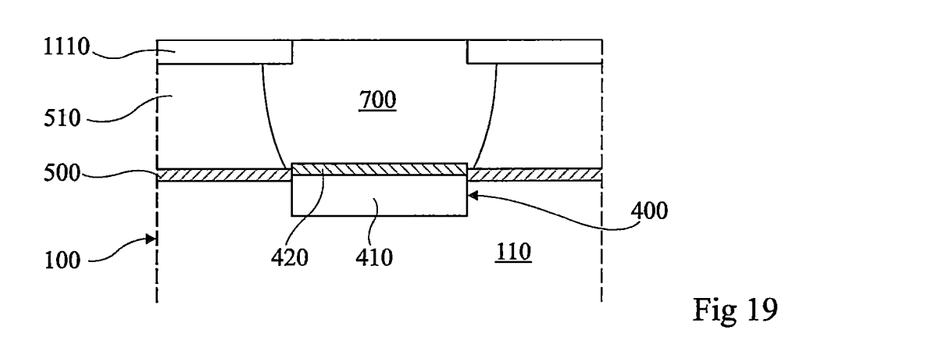
FIG. 19 is a partial simplified cross-section view showing another step of the variant of the fourth embodiment.

FIGS. 18 and 19 are partial simplified cross-section views showing steps of a variant of the fourth embodiment, implementing the variant of FIG. 17.

At the step of FIG. 18, metal layer 130 and, preferably, protection layer 140, are formed, in the way described in relation with FIG. 6. Metal layer 130 comprises a metal region 130A intended to react with semiconductor region 120A to form an intermetallic area. Due to the overhanging shape of the walls of openings 600 and 1112, metal region 130A is advantageously separated from the rest of layer 130, which eases the subsequent removal of the remaining portions of layer 130 after the reaction.

At the step of FIG. 19, a contacting area comprising intermetallic areas 410 and preferably 420 is formed, and opening 600 is filled with a conductor 700, as described in relation with FIG. 7.

Figure 20:
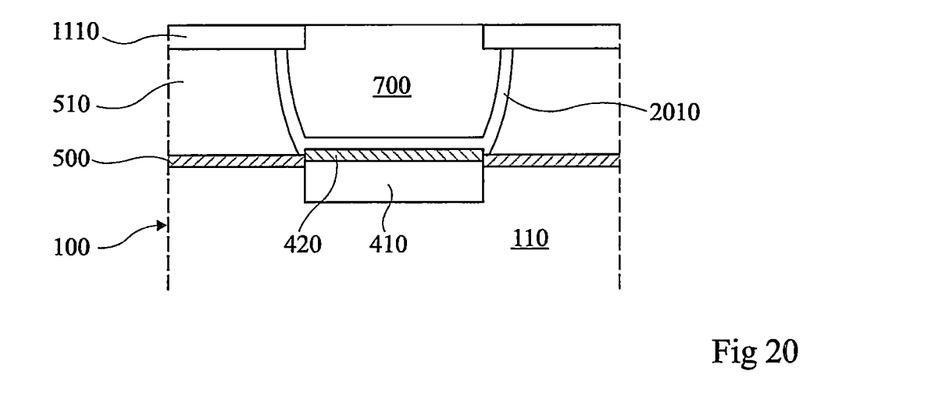
FIG. 20 is a partial simplified cross-section view showing a fifth embodiment of a contacting area manufacturing method, implementing the variant of FIG. 17.

FIG. 20 is a partial simplified cross-section view showing a fifth embodiment of a method of manufacturing a contacting area, implementing the variation of FIG. 17.

The fifth embodiment differs from the second embodiment (FIGS. 5 to 7) in that, at the step of FIG. 7, an electrically-conductive layer 2010 covering contacting area 400 is formed on the bottom and the sides of opening 600 before the filling of opening 600 with conductor 700.

Electrically-conductive layer 2010 is preferably made of titanium nitride TiN. Electrically-conductive layer 2010 is in contact with intermetallic area 420. The thickness of electrically-conductive layer 2010 is preferably in the range from 5 to 20 nm. Electrically-conductive layer 2010 enables to protect the upper surface of contacting area 420, in particular against a diffusion of the material of conductor 700 to the intermetallic area and/or against an oxidation in the case where the structure is exposed to air before the filling of opening 600 with conductor 700. The resistance is thus decreased and the reliability of the contacting area, with respect to a contacting area which is not covered with conductive layer 2010 is increased. Layer 2010, which is electrically conductive, further enables to form an electric contact between the contacting area and conductor 700.

Figure 21:
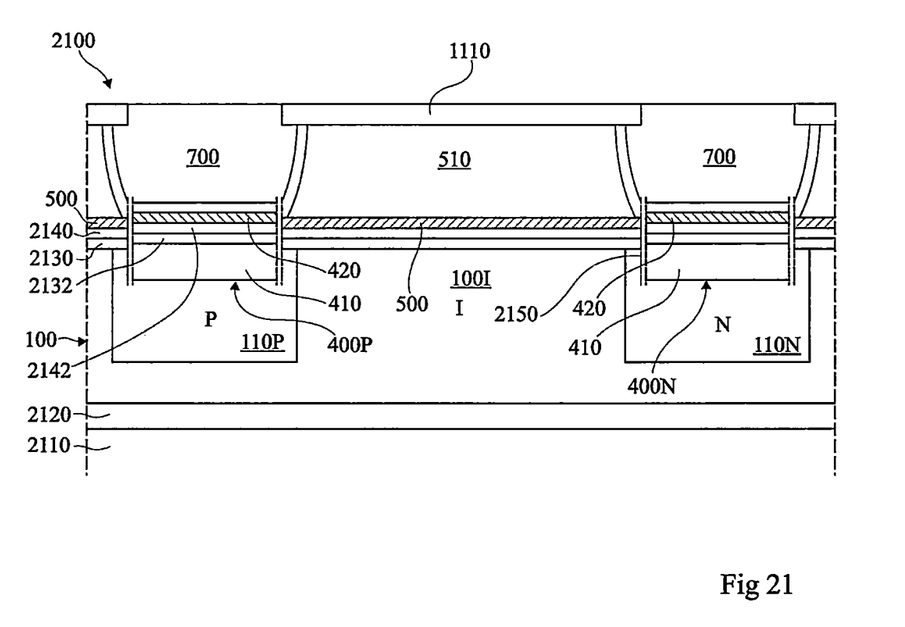
FIG. 21 is a partial simplified cross-section view showing an embodiment of a photodiode.

FIG. 21 is a partial simplified cross-section view showing an embodiment of a photodiode 2100. More precisely, the method of manufacturing photodiode 2100 here implements the fifth embodiment of the method of manufacturing a contacting area. The photodiode manufacturing method is compatible with the various above-described embodiments of contacting areas.

To form photodiode 2100, it is preferably provided for substrate 100 to be made of germanium. The germanium of substrate 100 is intrinsic, that is, non intentionally doped or having a doping level smaller than 1016 atoms/cm3, preferably smaller than or equal to 1015 atoms/cm3. The germanium of substrate 100 is preferably monocrystalline. As a variation, substrate 100 may be made of silicon-germanium, preferably intrinsic and monocrystalline.

Substrate 100 covers a silicon semiconductor wafer 2110. More particularly, an insulating layer 2120, typically made of silicon oxide, is arranged between semiconductor wafer 2110 and substrate 100. Semiconductor wafer 2110, insulating layer 2120, and substrate 100 thus define a structure of SOI type (Semiconductor On Insulator), more particularly, a GeOI structure (Germanium On Insulator). The thickness of insulating layer 2120 is for example in the range from 0.1 to 1 µm. The total thickness of substrate 100 is for example in the range from 1 to 2 µm.

A P-type doped germanium semiconductor region 110P and an N-type doped germanium semiconductor region 110N are formed in substrate 100. In other words, semiconductor regions 110N and 110P have opposite conductivity types. Semiconductor regions 110N and 110P extend from the free or accessible surface of substrate 100, that is, from the front surface (upper surface in the orientation of the drawing). Semiconductor regions 110N and 110P form the respective cathode and anode regions of photodiode 2100.

Preferably, semiconductor regions 110P and 110N are obtained by the forming of cavities in substrate 100 at the locations of semiconductor regions 110P and 110N, followed by the filling of the cavities by doped germanium epitaxy. This enables for the semiconductor regions to be, at least in an upper portion intended for the forming of the contacting areas, monocrystalline. As a variation, semiconductor regions 110N and 110P are obtained by ion implantation.

A semiconductor region 100I of substrate 100 separates semiconductor regions 110P and 110N. Semiconductor region 100I is thus made of intrinsic germanium. As an example, the distance separating semiconductor regions 110P and 110N is in the range from 1 µm to 20 µm.

Preferably, a silicon-germanium layer 2130, preferably monocrystalline, is formed on the structure and in particular on intrinsic region 100I. Silicon-germanium layer 2130 is preferably formed by epitaxy on substrate 100, more particularly on the free surface of substrate 100. Silicon-germanium layer 2130 is thus in contact with substrate 100. Silicon-germanium layer 2130 preferably has a thickness smaller than the critical thickness below which silicon-germanium layer 2130 remains monocrystalline during its epitaxial growth. Thus, the thickness of silicon-germanium layer 2130 is typically smaller than 3 nm.

Preferably, semiconductor layer 500 is then formed on silicon-germanium layer 2130. More preferably, before forming semiconductor layer 500, an intrinsic germanium layer 2140 is formed on silicon-germanium layer 2130. Germanium layer 2140 particularly enables semiconductor layer 500 to be monocrystalline. For this purpose, semiconductor layer 500 has a sufficiently low thickness, mentioned hereabove. Indeed, in the absence of germanium layer 2140, the sum of the thicknesses of silicon-germanium layer 2130 and of semiconductor layer 500 would be too high for semiconductor layer 500 to remain monocrystalline.

Insulating layer 510 is then formed, after which the fourth embodiment (FIG. 20) of the method of forming a contacting area is implemented in the shown example. More particularly, the method is implemented to simultaneously form two contacting areas 400N and 400P with respective semiconductor regions 110N and 110P. Each contacting area 400N, 400P thus comprises an intermetallic area 420, in which more than 70% of the non-metal atoms are silicon atoms and preferably an intermetallic area 410, where the non-metal atoms are mainly germanium atoms. The edges of the contacting areas are not shown (regions between dotted lines 2150). In the case where silicon-germanium layer 2130 is provided, the contacting area may further comprise an intermetallic area 2132 located on top of and in contact with intermetallic area 410. Intermetallic area 2132 comprises silicon atoms and germanium atoms. In the case where germanium layer 2140 is provided, the contacting area may further comprise an intermetallic area 2142 where the non-metal atoms are mainly, preferably are only, germanium atoms. Intermetallic area 2142 is located between areas 2132 and 420.

In the photodiode 2100 thus obtained, silicon-germanium layer 2130, located between semiconductor region 110I and insulating layer 510, is in contact with intrinsic region 100I. This enables to obtain a monocrystalline interface delimiting semiconductor region 110I. Such an interface enables to decrease the dark current of the photodiode, with respect to an interface having crystal defects. Further, germanium layer 2140 is located between silicon-germanium layer 2130 and insulating layer 510, preferably between silicon-germanium layer 2130 and semiconductor layer 500. Due to the fact the silicon-germanium has a band gap wider than that of germanium, carriers present in germanium layer 2140 cannot access intrinsic region 110I. The carriers may for example originate from defects at the interface of semiconductor layer 500 with insulating layer 510 and/or germanium layer 2140. Due to the fact that layers 2130 and 2140 enable to prevent such carriers from reaching intrinsic region 100I, the dark current of the photodiode is decreased with respect to the dark current of a photodiode which does not comprise layers 2130 and/or 2140.

Figure 22:
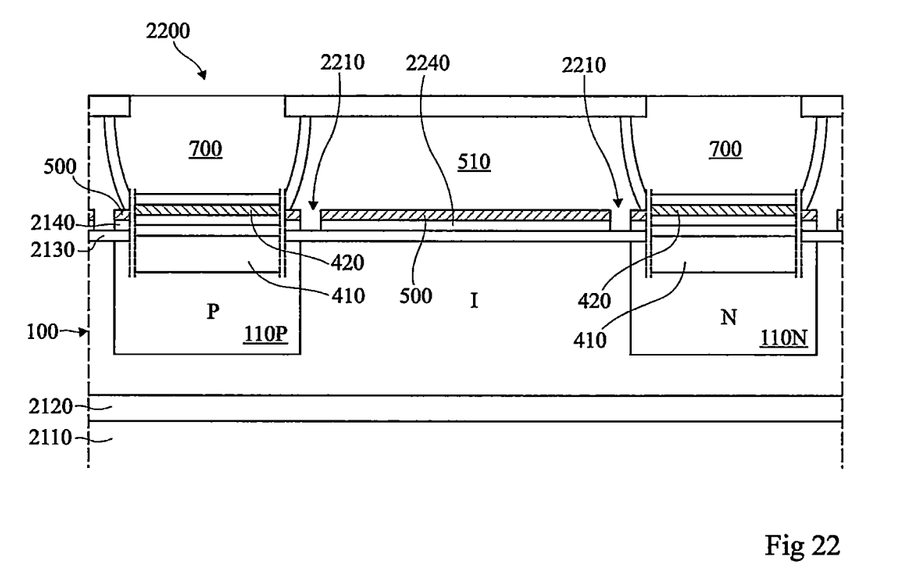
FIG. 22 is a partial simplified cross-section view showing another embodiment of a photodiode.

FIG. 22 is a partial simplified cross-section view showing another embodiment of a photodiode 2200. The method of manufacturing photodiode 2200 differs from that of the photodiode 2100 of FIG. 21 in that, before the forming of insulating layer 510, insulating trenches 2210 delimiting, on intrinsic region 100I, a portion 2240 of germanium layer 2140 have been formed. Preferably, insulating trenches 2210 are located vertically in line with the edges of intrinsic region 100I. The insulating trenches are then filled with an electric insulator, preferably, the insulator of layer 510.

As an example, trenches 2210 have a width in the range from 100 nm to 300 nm. In the shown example, the trenches extend from the upper surface of semiconductor layer 500, through layers 500 and 2140, down to the upper surface of silicon-germanium layer 2130. As a variation, trenches 2210 extend through layer 2130, for example, at least down to the upper surface of substrate 100.

Trenches 2210 thus form insulating layers delimiting a portion of germanium layer 2140 on intrinsic region 100I. These insulating layers are located between germanium layer 2140 and contacting areas 400N and 400P. Photodiode 2200 is compatible with any method of forming an intrinsic germanium layer located on intrinsic region 100I and delimited by insulating areas located between said germanium layer 2140 and the contacting areas. Thus, as a variation, germanium layer 2140 may be formed on intrinsic region 100I only.

Insulating areas 2210 enable to avoid for carriers present in germanium layer 2140, mentioned hereabove, to reach contacting areas 400N and 400P. Thus, the insulating layers enable photodiode 200 to have a dark current lower than that of a photodiode, such as the photodiode 2100 of FIG. 21, which does not comprise insulating areas 2210.

Various embodiments and variants have been described. Those skilled in the art will understand that certain features of these various embodiments and variants may be combined, and other variants will occur to those skilled in the art. In particular, the embodiments of methods of forming contacting areas comprising an opening forming step are compatible with the opening forming steps of FIGS. 11 to 15 and are compatible with the opening forming steps of FIGS. 17 and 18.

Finally, the practical implementation of the embodiments and variants described herein is within the capabilities of those skilled in the art based on the functional indications provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of forming an opening in an insulating layer covering a semiconductor region comprising germanium, successively comprising:
   a) forming a first masking layer on the insulating layer;
   b) forming on the first masking layer a second masking layer comprising an opening;
   c) etching an opening in the first masking layer, in line with the opening of the second masking layer;
   d) removing the second masking layer by oxygen-based etching; and
   e) forming the opening of said insulating layer in line with the opening of the first masking layer, by an etching where less than 5% of the reactive molecules used are oxygen molecules,
   wherein the insulating layer is located on and in contact with an additional semiconductor layer different from said semiconductor region, said additional semiconductor layer being made of silicon or having an atomic percentage of silicon greater than 70%, and said additional semiconductor layer covering said semiconductor region.

2. The method according to claim 1, wherein the insulating layer is made of silicon oxide.

3. The method according to claim 1, wherein the first masking layer is made of an electrically-insulating material, preferably from the group formed of $HfO_2$, $Al_2O_3$, AlN, ZnO, SiN, and $Si_3N_4$.

4. The method according to claim 1, wherein step e) comprises an etching with a plasma based on $C_4F_8$ and/or $CHF_3$, and/or with an HF solution.

5. The method according to claim 1, wherein the second masking layer is a polymer layer resulting from a lithography.

6. A method of forming a contacting area, comprising the implementation of the method according to claim 1, the contacting area being an area of contact with said semiconductor region and comprising an intermetallic area, the intermetallic area comprising non-metal atoms, wherein more than 70% of the non-metal atoms are silicon.

7. A method of forming a contacting area, successively comprising:
   a) forming a first masking layer on an insulating layer covering a semiconductor region comprising germanium;
   b) forming on the first masking layer a second masking layer comprising an opening;
   c) etching an opening in the first masking layer, in line with the opening of the second masking layer;
   d) removing the second masking layer by oxygen-based etching; and
   e) forming an opening of said insulating layer in line with the opening of the first masking layer, by an etching where less than 5% of the reactive molecules used are oxygen molecules,
   wherein the contacting area is an area of contact with said semiconductor region and comprises an intermetallic area, the intermetallic area comprises non-metal atoms, and more than 70% of the non-metal atoms are silicon.

8. The method according to claim 7, wherein the forming of said intermetallic area comprises reacting a semiconductor layer with a metal region, and the first masking layer and the metal region comprise a same metal.

9. The method according to claim 7, wherein the forming of the intermetallic area comprises reacting a semiconductor with a metal region covered with a protection layer, and the first masking layer and the protection layer comprise a same metal.

10. The method according to claim 7, further comprising: forming an electrically-conductive layer covering the contacting area and walls of the opening of the insulating layer and filling the opening of the insulating layer with a conductor covering said electrically-conductive layer.

11. A method of forming a photodiode comprising:
forming, by the method according to a claim 7, first and second respective areas of contact with first and second semiconductor regions comprising germanium, the first and second semiconductor regions being doped with opposite conductivity types and separated by a third semiconductor region comprising intrinsic germanium.

12. The method according to claim 11, wherein a silicon-germanium layer is located between the third semiconductor region and said insulating layer and is in contact with the third semiconductor region.

13. The method according to claim 12, wherein an intrinsic germanium layer is located between said silicon-germanium layer and said insulating layer.

14. The method according to claim 13, comprising:
forming insulating areas delimiting said intrinsic germanium layer and located between said intrinsic germanium layer and the first and second areas of contact.

15. A photodiode formed by the method according to claim 11.

16. A method of forming a contacting area, successively comprising:
a) forming a first masking layer on an insulating layer covering a semiconductor region comprising germanium;
b) forming on the first masking layer a second masking layer comprising an opening;
c) etching an opening in the first masking layer, in line with the opening of the second masking layer;
d) removing the second masking layer by oxygen-based etching; and
e) forming an opening of said insulating layer in line with the opening of the first masking layer, by an etching where less than 5% of the reactive molecules used are oxygen molecules,
wherein the contacting area comprises an intermetallic area formed by reacting a semiconductor with a metal region, and the first masking layer and the metal region comprise a same metal.

17. The method according to claim 16, wherein the forming of the intermetallic area comprises reacting the semiconductor with the metal region covered with a protection layer, and the first masking layer and the protection layer comprise a same metal.

18. The method according to claim 16, further comprising:
forming an electrically-conductive layer covering the contacting area and walls of the opening of the insulating layer; and
filling the opening of the insulating layer with a conductor covering said electrically-conductive layer.

19. A method of forming a photodiode comprising: forming, by the method according to a claim 16, first and second respective areas of contact with first and second semiconductor regions comprising germanium, the first and second semiconductor regions being doped with opposite conductivity types and separated by a third semiconductor region comprising intrinsic germanium.

20. The method according to claim 19, wherein a silicon-germanium layer is located between the third semiconductor region and said insulating layer and is in contact with the third semiconductor region.

* * * * *